US009786331B1

(12) United States Patent
Wallash (10) Patent No.: US 9,786,331 B1
(45) Date of Patent: Oct. 10, 2017

(54) SHIELDED THREE-LAYER PATTERNED GROUND STRUCTURE

(71) Applicant: Western Digital Technologies, Inc., San Jose, CA (US)

(72) Inventor: Albert John Wallash, Morgan Hill, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 15/220,175

(22) Filed: Jul. 26, 2016

(51) Int. Cl.
G11B 33/14 (2006.01)
H05K 1/02 (2006.01)
G06F 1/18 (2006.01)

(52) U.S. Cl.
CPC .......... *G11B 33/1493* (2013.01); *G06F 1/182* (2013.01); *H05K 1/0224* (2013.01); *H05K 1/0225* (2013.01); *H05K 2201/0715* (2013.01); *H05K 2201/10242* (2013.01); *H05K 2201/2072* (2013.01)

(58) Field of Classification Search
None
See application file for complete search history.

(56) References Cited

U.S. PATENT DOCUMENTS

| 6,714,385 | B1 | 3/2004 | Even et al. |
| 6,782,243 | B2 | 8/2004 | Shiotsu et al. |
| 8,339,212 | B2 | 12/2012 | Wu et al. |
| 8,735,738 | B2 | 5/2014 | Wen et al. |
| 9,155,189 | B1 | 10/2015 | Chen et al. |
| 9,241,400 | B2 | 1/2016 | Shaw et al. |
| 2009/0244877 | A1 | 10/2009 | Yeh et al. |
| 2012/0081869 | A1 | 4/2012 | Kim et al. |
| 2012/0188025 | A1 | 7/2012 | Wu et al. |
| 2014/0049343 | A1 | 2/2014 | Sakai |

FOREIGN PATENT DOCUMENTS

WO 2014/045792 A1 3/2014

OTHER PUBLICATIONS

Weng, et al.; Synthesis Model and Design of a Common-Mode Bandstop Filter (CM-BSF) With an All-Pass Characteristic for High-Speed Differential Signals; dated Jun. 13, 2014; 2 total pages.
Liu, et al.; PCB Structures for Common Mode Suppression on Differential Microstrip Lines; dated Aug. 4-8, 2014; 1 page.

(Continued)

*Primary Examiner* — Craig A. Renner
(74) *Attorney, Agent, or Firm* — Patterson & Sheridan, LLP (57) ABSTRACT

The present disclosure generally relates to a shielded three-layer patterned ground structure in a PCB. The PCB may be disposed in a hard disk drive. To reduce costs, PCBs are being made with only four total layers separated by dielectric material. Conductive traces in PCBs can have the problem of common mode current flowing through the traces and thus increasing the magnitude of EMI noise. By providing a shielded three-layer patterned ground structure, not only is the cost reduced, but so is the common mode current and the magnitude of EMI noise, all without any negative impact to the differential signal.

22 Claims, 8 Drawing Sheets

(56) References Cited

OTHER PUBLICATIONS

Lee, et al.; A Compact Common-Mode Suppression Filter Using Modified Ground Structure for High Speed Digital Interconnects on Multi-Layered PCB; dated Sep. 1-4, 2014; 2 total pages.

Zhuang, et al.; Common-Mode Suppression Design for Gigahertz Differential Signals Based on C-Slotline; Progress in Electromagnetics Research C, vol. 61, 17-26; dated 2016; 10 total pages.

Dr. N. Suresh kumar, "Suppression of Common-Mode Radiation From High Speed Printed Circuit Board Using Modified Ground Patterns", IJIST, vol. 4, No. 3, May 2014.

International Search Report and Written Opinion for PCT/US20171030735 dated Aug. 8, 2017.

SHIELDED THREE-LAYER PATTERNED GROUND STRUCTURE

BACKGROUND OF THE DISCLOSURE

Field of the Disclosure

Embodiments of the present disclosure generally relate to a printed circuit board (PCB) having a shielded patterned ground structure (PGS).

Description of the Related Art

The latest generation of hard disk drives (HDDs) utilize PCBs outside of the HDDs with silicon on chip (SoC) technology. Traces are used to run the electrical current from the SoC to the edge of the PCB. A common mode current flows through the traces typically and thus generates electromagnetic interference (EMI). The magnitude of the EMI can cause problems for hard disk drive operation at certain frequencies.

To solve the EMI problem, a surface mounted common-mode filter can be used. However, a surface mounted common-mode filter, while correcting EMI, impacts signal integrity and thus is not a viable solution. Another possible solution is to simply change the connection to the PCB, but such a change impacts space requirements and signal integrity. What is needed is a way to deal with the common mode current problem without impacting the signal integrity.

Therefore, there is a need in the art to reduce and/or eliminate common mode current in PCBs which leads to undesirable EMI.

SUMMARY OF THE DISCLOSURE

The present disclosure generally relates to a shielded three-layer patterned ground structure in a PCB. The PCB may be disposed in a HDD. To reduce costs, PCBs are being made with only four total layers separated by dielectric material. Conductive traces in PCBs can have the problem of common mode current flowing through the traces and thus increasing the magnitude of EMI noise. By providing a shielded three-layer patterned ground structure, not only is the cost reduced, but so is the common mode current and the magnitude of EMI noise, all without any negative impact to the differential signal.

In one embodiment, a PCB comprises a patterned ground shield (PGS); a middle shield, wherein the patterned ground shield is laterally spaced from the middle shield by a moat, wherein the moat is filled with dielectric material; a top shield having a first portion and a second portion, wherein the first portion is spaced from the second portion, wherein the first portion is disposed over at least a portion of the moat, wherein the second portion is disposed over at least a different portion of the moat; and a pair of conductive traces disposed between the first portion and the second portion, wherein the pair of conductive traces is disposed over the patterned ground shield. It is to be understood that the PGS is not limited to use with an HDD. Rather, the PGS may be utilized in solid state devices (SSD) as well.

In another embodiment, a PCB comprises a first shield layer comprising a first conductive material; a second shield layer that is spaced from the first shield layer by a first dielectric material, wherein the second shield layer comprises a second conductive material, wherein the second shield layer has a main portion and a first patterned ground structure, wherein the first patterned ground structure is spaced from the main portion on all sides by a moat that is filled with a second dielectric material when viewed from a top view; a third shield layer disposed over the second shield layer and spaced from the second shield layer by a third dielectric material, wherein the third shield layer comprises a first portion and a second portion, wherein the first portion and the second portion are each disposed over the moat when viewed from the top view; and a first set of traces disposed between the first portion and the second portion. It is to be understood that the PGSs is not limited to use with an HDD. Rather, the PGS may be utilized in SSD as well.

In another embodiment, a HDD comprises a housing; one or more magnetic medias disposed within the housing; and a PCB coupled to the housing. The PCB comprises: a PGS; a middle shield, wherein the patterned ground shield is laterally spaced from the middle shield by a moat, wherein the moat is filled with dielectric material; a top shield having a first portion and a second portion, wherein the first portion is spaced from the second portion, wherein the first portion is disposed over at least a portion of the moat, wherein the second portion is disposed over at least a different portion of the moat; and a pair of conductive traces disposed between the first portion and the second portion, wherein the pair of conductive traces is disposed over the PGS.

In another embodiment, a HDD comprises a housing; one or more magnetic medias disposed within the housing; and a PCB coupled to the housing. The PCB comprises: a first shield layer comprising a first conductive material; a second shield layer that is spaced from the first shield layer by a first dielectric material, wherein the second shield layer comprises a second conductive material, wherein the second shield layer has an outer portion and a first patterned ground structure, wherein the first patterned ground structure is spaced from the outer portion on all sides by the second dielectric material when viewed from a top view; a third shield layer disposed over the second shield layer and spaced from the second shield layer by a third dielectric material, wherein the third shield layer comprises a first portion and a second portion, wherein the first portion and the second portion are each disposed over the second dielectric material when viewed from the top view; and a first set of traces disposed between the first portion and the second portion.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to a shielded three-layer PGS in a PCB. The PCB may be disposed in a HDD. To reduce costs, PCBs are being made with only four total layers separated by dielectric material. Conductive traces in PCBs can have the problem of common mode current flowing through the traces and thus increasing the magnitude of EMI noise. By providing a shielded three-layer patterned ground structure, not only is the cost reduced, but so is the common mode current and the magnitude of EMI noise, all without any negative impact to the differential signal.

Figure 1:
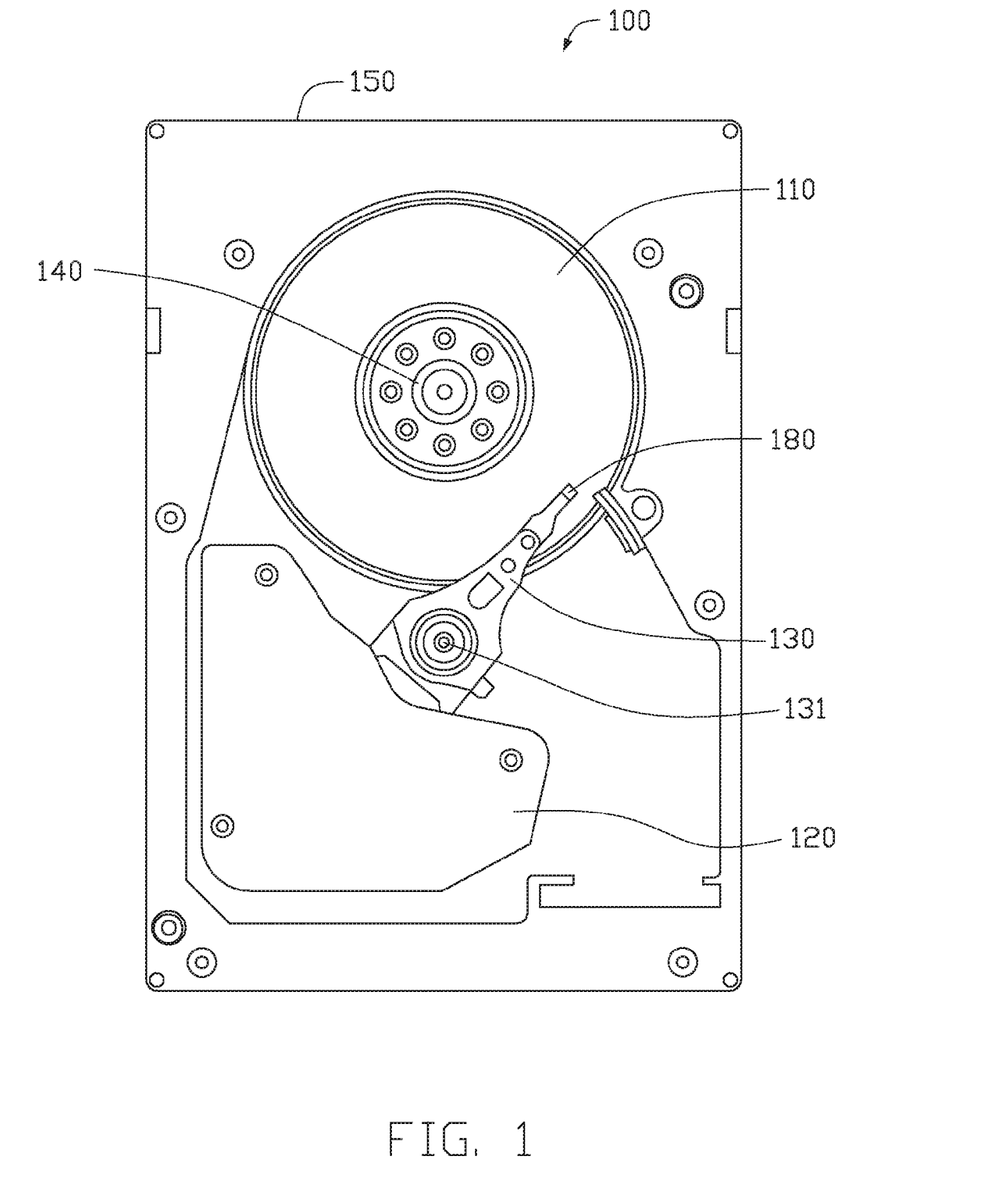
FIG. 1 is a schematic top illustration of a HDD.

FIG. 1 illustrates a top view of an exemplary HDD 100, according to an embodiment of the invention. As illustrated, HDD 100 may include one or more magnetic media, or disks 110, actuator 120, actuator arms 130 associated with each of the magnetic disks 110, and spindle motor 140 affixed in a chassis 150. The one or more magnetic disks 110 may be arranged vertically as illustrated in FIG. 1. Moreover, the one or more magnetic disks may be coupled with the spindle motor 140.

Magnetic disks 110 may include circular tracks of data on both the top and bottom surfaces of the disk. A magnetic head 180 mounted on a slider may be positioned on a track. As each disk spins, data may be written on and/or read from the data track. Magnetic head 180 may be coupled to an actuator arm 130 as illustrated in FIG. 1. Actuator arm 130 may be configured to swivel around actuator axis 131 to place magnetic head 180 on a particular data track.

Figure 2:
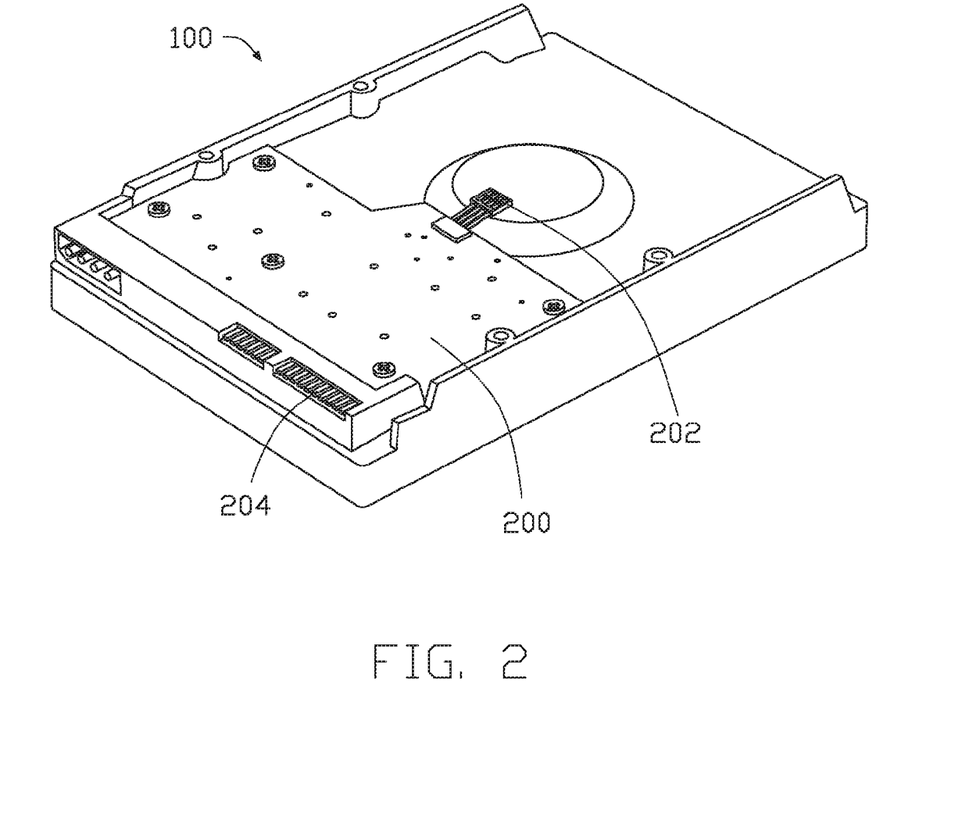
FIG. 2 is a schematic bottom illustration of a HDD including a PCB.

FIG. 2 is a schematic bottom illustration of a HDD 100 including a PCB 200. The PCB 200 has electrical connections 202 to the HDD 100 and electrical connections 204 to be used to connect to the computer in which the HDD 100 is to be placed.

It is to be understood that while FIGS. 1 and 2 are directed to a HDD 100, it is to be understood that the PGSs described herein are not limited to use with an HDD. Rather, the PGSs may be utilized in SSD as well as any card or PCB that has an emissions problem due to excessive common mode signal.

Figure 3A:
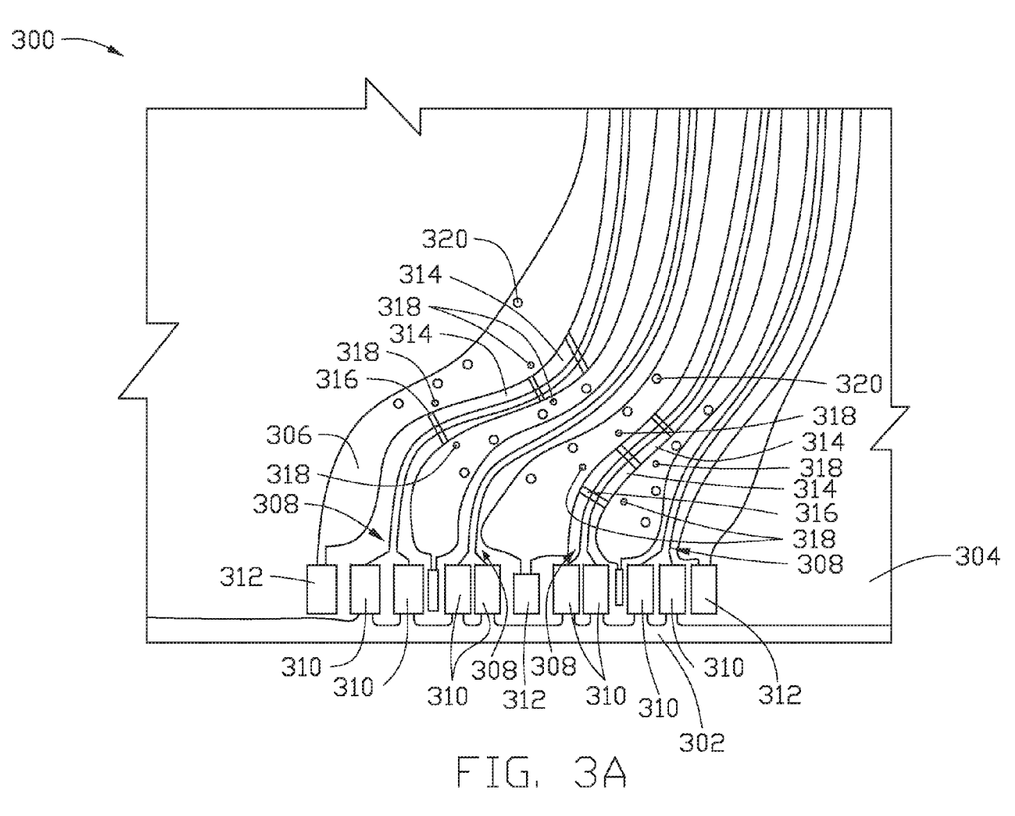
FIG. 3A is a schematic illustration of a PCB according to one embodiment.
Figure 3B:
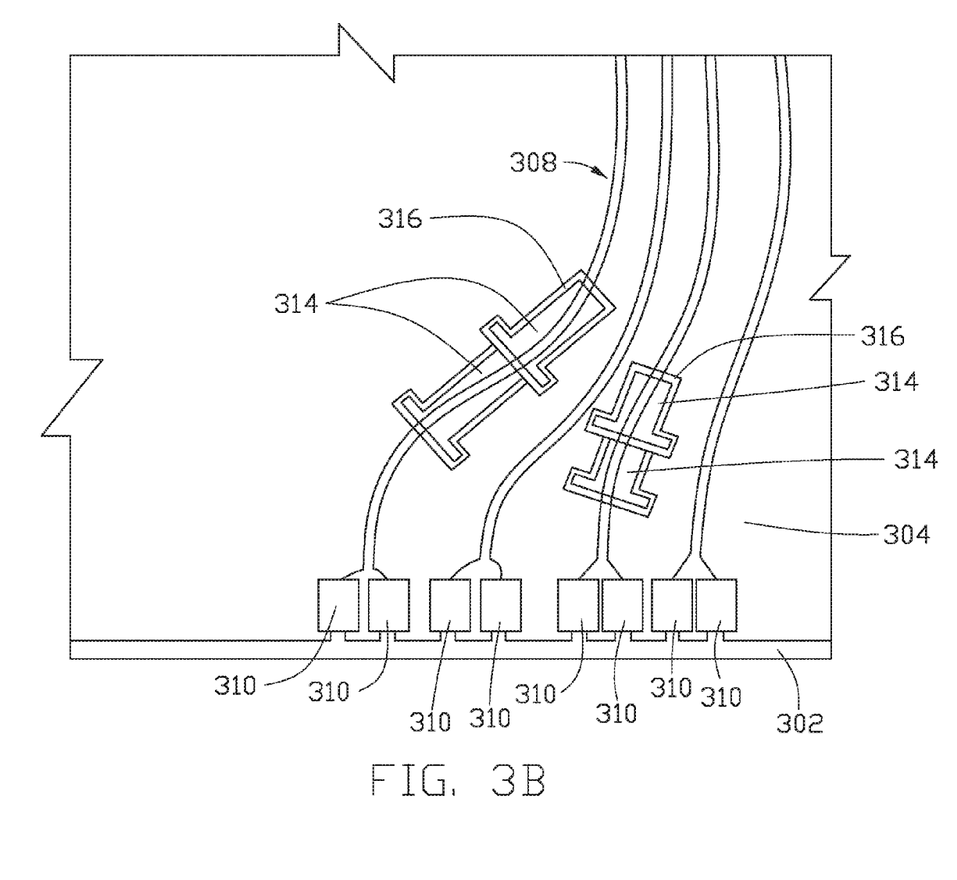
FIG. 3B is a schematic illustration of the PCB of FIG. 3A with the third shield layer removed in select locations.

FIG. 3A is a schematic illustration of a PCB 300 according to one embodiment. FIG. 3A shows the PCB 300 having a bottom shield 302, a middle shield 304 and a top shield 306. Conductive trace pairs 308 extend on the middle shield 304 to first end pads 310, and the top shield 306 is coupled to second end pads 312 that are disposed on the middle shield 304. In FIG. 3B, the top shield 306 has been removed for clarity.

The middle shield 304 has a plurality of PGSs 314 that are best shown in FIG. 3B, but slightly visible in FIG. 3A. The PGS 314 is a portion of the middle shield 304 that is entirely spaced from the main portion of the middle shield 304 by a moat 316. The moat 316 is dielectric material that spaces the PGS 314 from the main portion of the middle shield 304. During operation, the trace pairs 308 have a common mode signal passing thereon. The common mode signal is the cause of EMI detected in HDDs. The PGS 314 is used to reduce and even eliminate the common mode signal on the traces 308.

As shown in FIG. 3B, the PGS has a "T" shaped structure, but it is to be understood that other shapes may be utilized as well. Two anchor elements 318 extend through the top shield 306, PGS 314 and bottom shield 302. The anchor elements 318 "anchor" the PGS 314 to control the resonance of the PGS 314. Additional anchor elements 320 are also present extending through the top shield 306, main portion of the middle shield 304 and the bottom shield 302.

While there are four trace pairs 308 shown, there are only PGSs 314 on two trace pairs 308. The common mode signal is present on the transmission lines, but not on the receiving lines. Hence, the PGSs 314 are only on the pairs of traces 308 that correspond to the transmit lines. Thus, while not necessary, it is contemplated that PGSs may be present on the receiving lines.

Figure 4A:
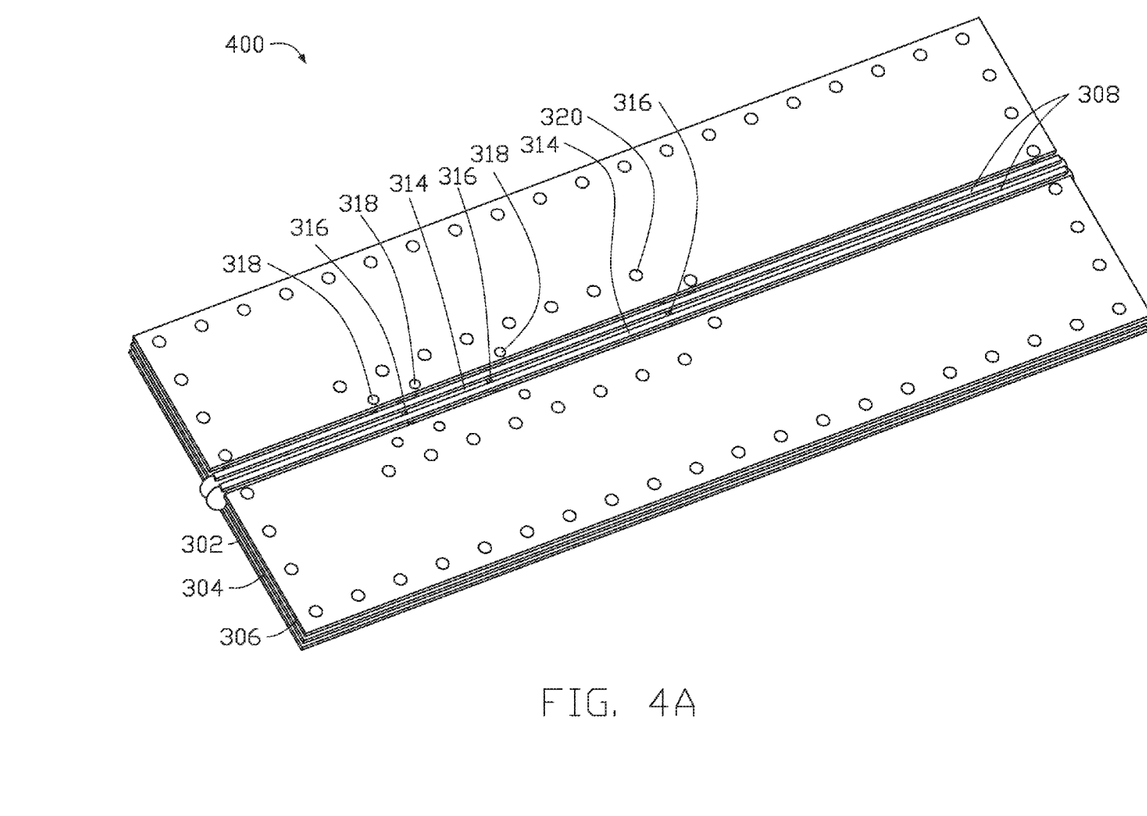
FIG. 4A is an isometric illustration of a PCB having a three layer shield structure.

FIG. 4A is an isometric illustration of a PCB 400 having a three layer shield structure. The top shield 306 is visible as is the middle shield 304 and bottom shield 302. A portion of the moats 316 are also visible as are the various anchor elements 318, 320. A pair of conductive traces 308 is also shown.

Figure 4B:
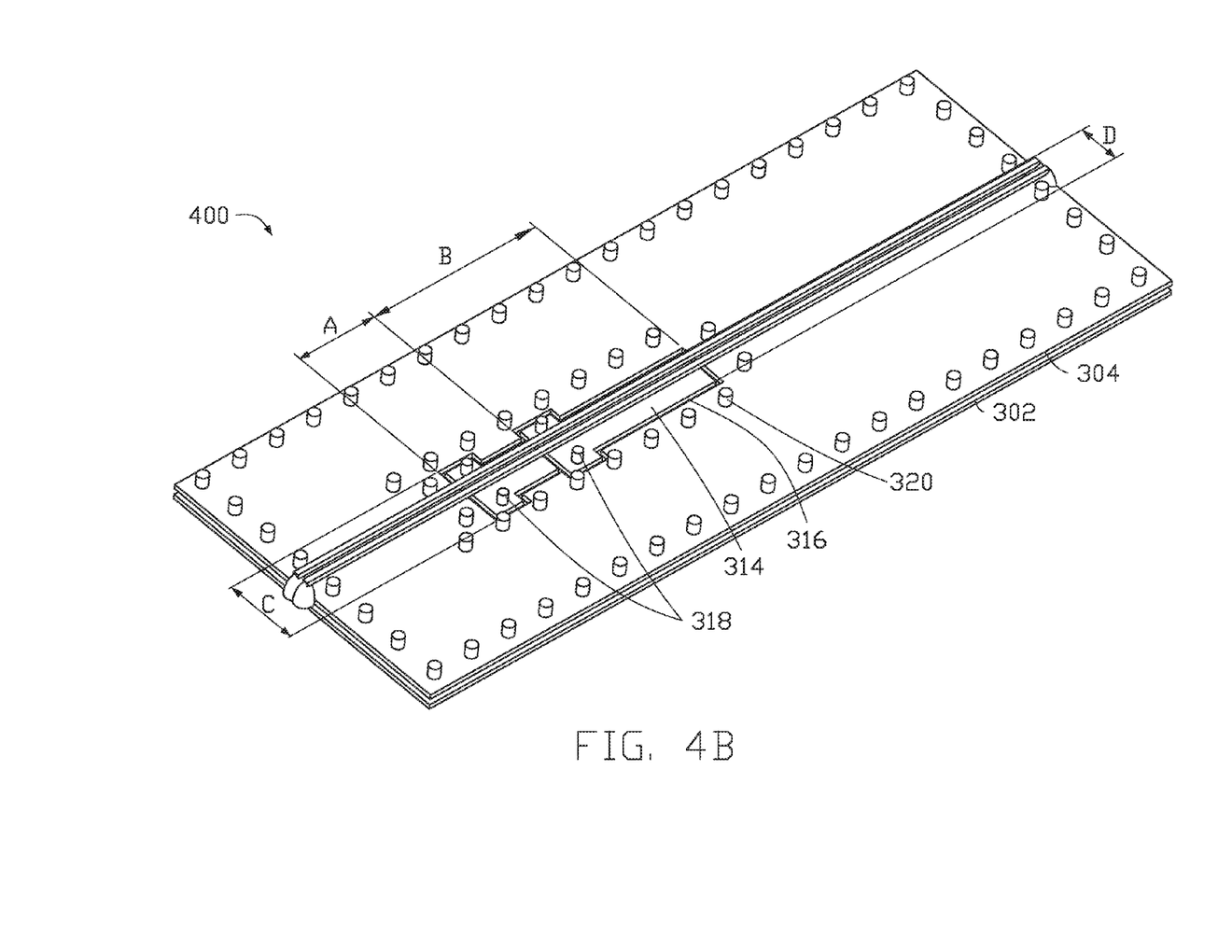
FIG. 4B is an isometric illustration of the PCB of FIG. 4A with the top shield removed.

FIG. 4B is an isometric illustration of the PCB 400 of FIG. 4A with the top shield 306 removed. Because the top shield 306 is removed, the PGS 314 is clearly visible as is the entire moat 316. Two PGSs 314 are shown, but it is to be understood that additional PGSs may be present. The PGSs 314 shown in FIG. 4B each have a length shown by arrows "A" and "B". As shown in FIG. 4B, PGS 314 has a length "A" that is less than the length "B" of the other PGS 314. Because the PGSs 314 have "T" shapes, the PGSs 314 have two widths represented by arrows "C" and "D". Arrows "C" represents the width of the PGSs 314 at the top of the "T" structure while arrows "D" represent the width of the PGSs 314 at the bottom of the PGSs 314. In the embodiment shown in FIG. 4B, the widths represented by arrows "C" and "D" are identical for the PGSs 314. It is contemplated, however, each PGS 314 may have a different width. Furthermore, it is contemplated that each PGS 314 may have a different shape. Typically, the moat 316 is filled with dielectric material, but, for clarity purposes, the dielectric material is not shown in the moat 316 so that the bottom shield 302 is visible. As shown in FIG. 4B, the length of the PGS 314 is substantially parallel to the pair of traces 308 while the width of the PGS 314 is substantially perpendicular to the pair of traces 308. As will be discussed below, but can be understood from considering FIGS. 4A and 4B together, the top shield 306 covers the moat 316 along the length of the PGS 314 so that only a portion of moat 316 corresponding to the width of the PGS 314 is exposed. It is to be noted, however, that the entire width of the moat 316 is not exposed.

Figure 4C:
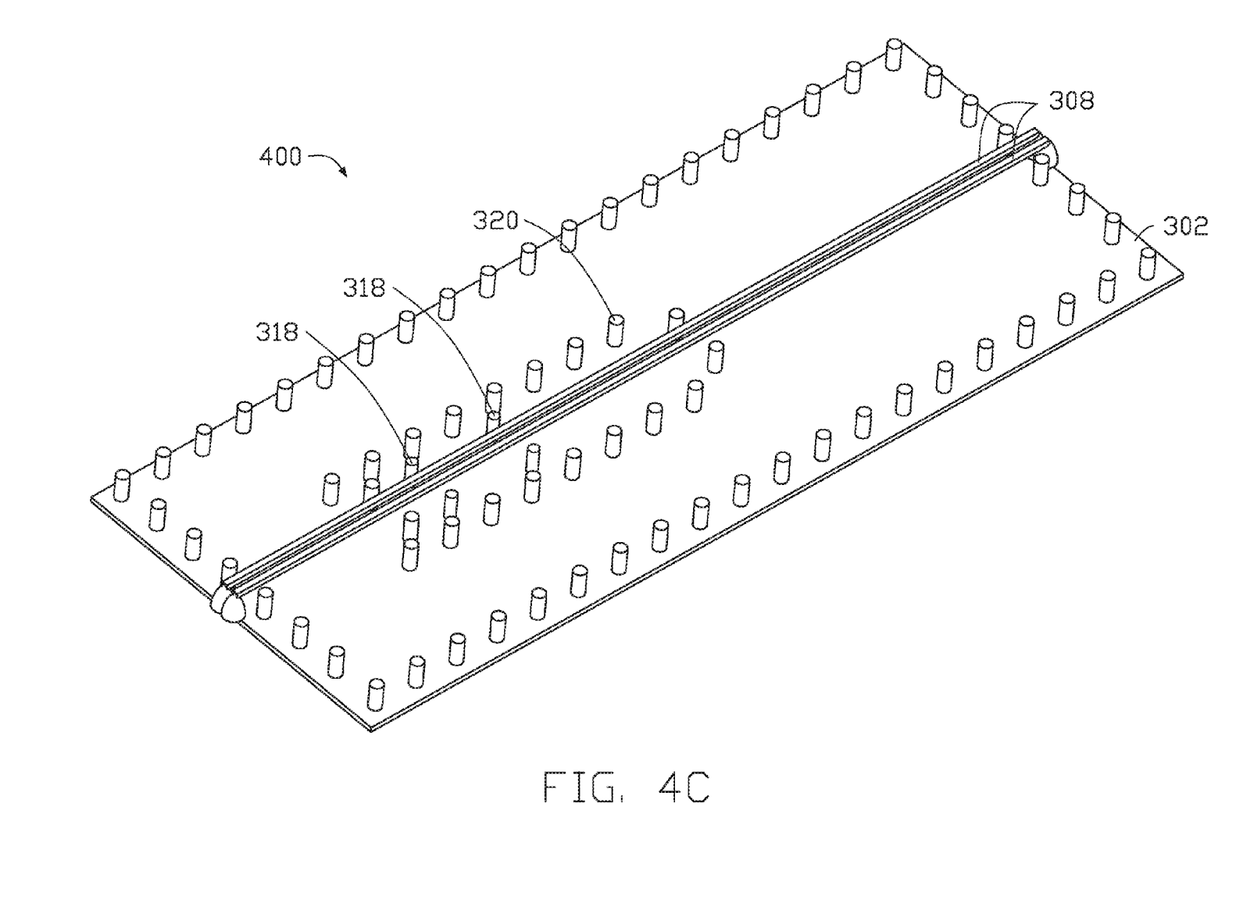
FIG. 4C is an isometric illustration of the PCB of FIG. 4B with the PGS removed.

FIG. 4C is an isometric illustration of the PCB 400 of FIG. 4B with the PGS 314 removed. The pair of traces 308 remains in the view for clarity purposes. The various anchor elements 318, 320 are also visible.

Figure 5A:
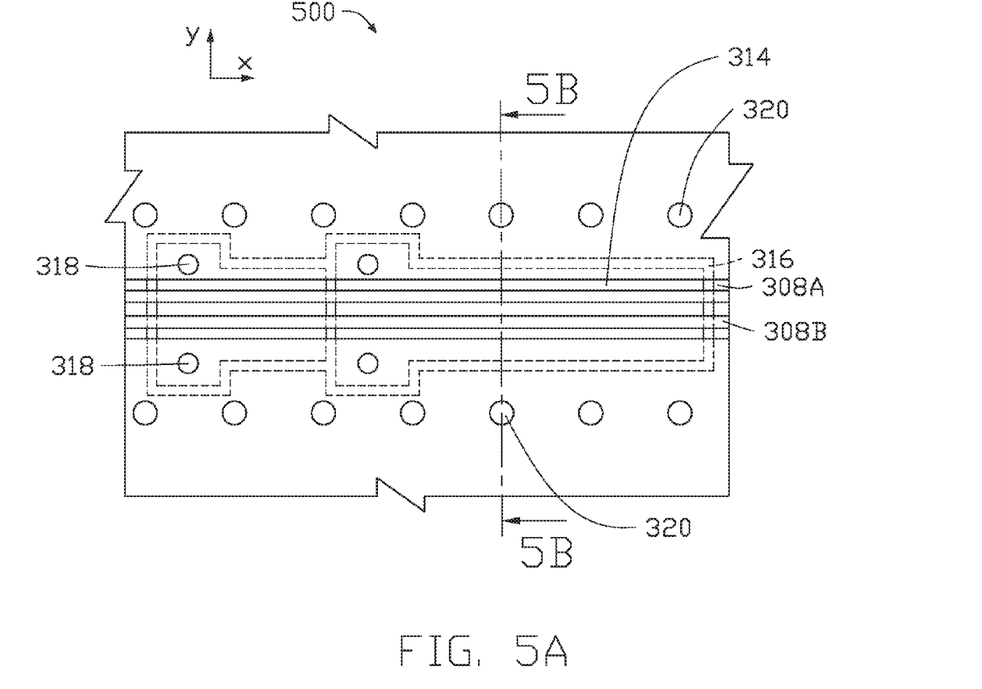
FIG. 5A is a top view of a PCB according to one embodiment.
Figure 5B:
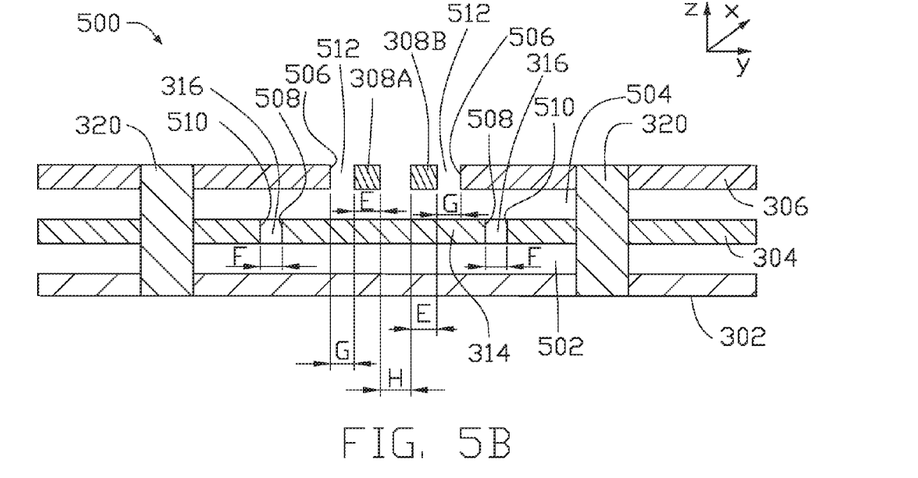
FIG. 5B is a cross-sectional illustration of the PCB of FIG. 5A.

FIG. 5A is a top view of a PCB 500 according to one embodiment. FIG. 5B is a cross-sectional illustration of the PCB 500 of FIG. 5A. As shown in FIG. 5B, a dielectric layer 502 is disposed between the bottom shield 302 and middle shield 304/PGS 314. A second dielectric layer 504 is disposed between the middle shield 304/PGS 314 and the top shield 306/traces 308A, 308B. Additionally, dielectric material is disposed within the moat 316 and between the traces 308A, 308B and between the traces 308A, 308B and the top shield 306.

As shown in FIG. 5B, the ends 510 of the middle shield 304 are spaced from the ends 508 of the PGS 314 by a distance represented by arrow "F". Additionally, the traces 308A, 308B have a width shown by arrows "E", and the ends 506 of the top shield 306 are spaced from the traces 308A, 308B by a distance represented by arrows "G". The traces 308A, 308B are spaced apart by a distance represented by arrows "H".

The top shield 306 completely covers the moat 316 when viewed in cross-section. The moat 316 is not vertically aligned with the opening 512 disposed between the ends 506 of the top shield 306 and the traces 308A, 308B. The moat 316, along the entire length represented by arrows "A" and "B" is "covered" by the top shield 306 such that the ends 506 of the top shield 306 are vertically aligned over the PGS 314. Furthermore, the ends 506 of the top shield 306 are not vertically aligned with the ends 508 of the PGS 314 as shown in FIG. 5B. It is contemplated that the ends 506, 508 may be vertically aligned so long as the moat 316 is "covered" by the top shield 306.

The bottom shield 302, middle shield 304, top shield 306, traces 308A, 308B, anchor elements 318, 320 and PGS 314 may all compared a conductive material such as copper, tantalum, titanium, tungsten and allows thereof. In one embodiment, the bottom shield 302, middle shield 304, top shield 306, traces 308A, 308B and PGS 314 all comprise the same material. It is contemplated that the bottom shield 302, middle shield 304, top shield 306, traces 308A, 308B, anchor elements 318, 320 and PGS 314 all comprise different material. The dielectric layers 502, 504 may comprise insulating material such as silicon oxide, silicon nitride, silicon oxynitride or other dielectric material. Furthermore, the moat 316 and openings 512 may be filled with an insulating material such as silicon oxide, silicon nitride, silicon oxynitride or other dielectric material. Additionally, the openings 514 between the traces 308A, 308B may be filled with an insulating material such as silicon oxide, silicon nitride, silicon oxynitride or other dielectric material. The insulating material for the dielectric layers 502, 504, moat 316, and openings 512, 514 may comprise the same material, but it is contemplates that the material may be different.

By utilizing a patterned ground structure that shields the traces, common mode current in PCBs can be reduced and or eliminated. The size of the resonator cavity (i.e., the area surrounded by the moat) in the patterned ground structure, as well as the location of the anchor elements, determines the frequency of the common mode current to be reduced and/or eliminated. Thus, based upon the desired frequency to eliminate, the patterned ground structure can be tailored to suit the product's need.

While the foregoing is directed to embodiments of the present disclosure, other and further embodiments of the disclosure may be devised without departing from the basic scope thereof, and the scope thereof is determined by the claims that follow.

What is claimed is:

1. A printed circuit board, comprising:
   a patterned ground shield;
   a middle shield, wherein the patterned ground shield is laterally spaced from the middle shield by a moat, wherein the moat is filled with dielectric material;
   a top shield having a first portion and a second portion, wherein the first portion is spaced from the second portion, wherein the first portion is disposed over at least a portion of the moat, wherein the second portion is disposed over at least a different portion of the moat; and
   a pair of conductive traces disposed between the first portion and the second portion, wherein the pair of conductive traces is disposed over the patterned ground shield.

2. The printed circuit board of claim 1, further comprising a first anchor element, wherein the first anchor element extends through the first portion and the patterned ground shield.

3. The printed circuit board of claim 2, further comprising a second anchor element, wherein the second anchor element extends through the second portion and the patterned ground shield.

4. A printed circuit board, comprising:
   a first shield layer comprising a first conductive material;
   a second shield layer that is spaced from the first shield layer by a first dielectric material, wherein the second shield layer comprises a second conductive material, wherein the second shield layer has a main portion and a first patterned ground structure, wherein the first patterned ground structure is spaced from the main portion on all sides by a moat filled with a second dielectric material when viewed from a top view;
   a third shield layer disposed over the second shield layer and spaced from the second shield layer by a third dielectric material, wherein the third shield layer comprises a first portion and a second portion, wherein the first portion and the second portion are each disposed over the moat when viewed from the top view; and
   a first set of traces disposed between the first portion and the second portion.

5. The printed circuit board of claim 4, further comprising a second patterned ground structure, wherein the first patterned ground structure has a different length than the second patterned ground structure.

6. The printed circuit board of claim 5, further comprising a first anchor element, wherein the first anchor element extends through the first portion, the first patterned ground structure and the first shield layer.

7. The printed circuit board of claim 6, further comprising a second anchor element, wherein the second anchor element extends through the second portion, the first patterned ground structure and the first shield layer.

8. The printed circuit board of claim 7, further comprising a third anchor element, wherein the third anchor element extends through the first portion, the second patterned ground structure and the first shield layer.

9. The printed circuit board of claim 8, further comprising a fourth anchor element, wherein the fourth anchor element extends through the second portion, the second patterned ground structure and the first shield layer.

10. The printed circuit board of claim 9, further comprising a fifth anchor element, wherein the fifth anchor element extends through the first portion, the main portion and the first shield layer.

11. The printed circuit board of claim 10, further comprising a sixth anchor element, wherein the sixth anchor element extends through the second portion, the main portion and the first shield layer.

12. A hard disk drive, comprising:
a housing;
one or more magnetic medias disposed within the housing; and
a printed circuit board coupled to the housing, wherein the printed circuit board comprises:
a patterned ground shield;
a middle shield, wherein the patterned ground shield is laterally spaced from the middle shield by a moat, wherein the moat is filled with dielectric material;
a top shield having a first portion and a second portion, wherein the first portion is spaced from the second portion, wherein the first portion is disposed over at least a portion of the moat, wherein the second portion is disposed over at least a different portion of the moat; and
a pair of conductive traces disposed between the first portion and the second portion, wherein the pair of conductive traces is disposed over the patterned ground shield.

13. The hard disk drive of claim 12, further comprising a first anchor element, wherein the first anchor element extends through the first portion and the patterned ground shield.

14. The hard disk drive of claim 13, further comprising a second anchor element, wherein the second anchor element extends through the second portion and the patterned ground shield.

15. A hard disk drive, comprising:
a housing;
one or more magnetic medias disposed within the housing; and
a printed circuit board coupled to the housing, wherein the printed circuit board comprises:
a first shield layer comprising a first conductive material;
a second shield layer that is spaced from the first shield layer by a first dielectric material, wherein the second shield layer comprises a second conductive material, wherein the second shield layer has a main portion and a first patterned ground structure, wherein the first patterned ground structure is spaced from the main portion on all sides by a moat filed with a second dielectric material when viewed from a top view;
a third shield layer disposed over the second shield layer and spaced from the second shield layer by a third dielectric material, wherein the third shield layer comprises a first portion and a second portion, wherein the first portion and the second portion are each disposed over the moat when viewed from the top view; and
a first set of traces disposed between the first portion and the second portion.

16. The hard disk drive of claim 15, further comprising a second patterned ground structure, wherein the first patterned ground structure has a different length than the second patterned ground structure.

17. The hard disk drive of claim 16, further comprising a first anchor element, wherein the first anchor element extends through the first portion, the first patterned ground structure and the first shield layer.

18. The hard disk drive of claim 17, further comprising a second anchor element, wherein the second anchor element extends through the second portion, the first patterned ground structure and the first shield layer.

19. The hard disk drive of claim 18, further comprising a third anchor element, wherein the third anchor element extends through the first portion, the second patterned ground structure and the first shield layer.

20. The hard disk drive of claim 19, further comprising a fourth anchor element, wherein the fourth anchor element extends through the second portion, the second patterned ground structure and the first shield layer.

21. The hard disk drive of claim 20, further comprising a fifth anchor element, wherein the fifth anchor element extends through the first portion, the main portion and the first shield layer.

22. The hard disk drive of claim 21, further comprising a sixth anchor element, wherein the sixth anchor element extends through the second portion, the main portion and the first shield layer.

* * * * *